United States Patent
Yune

(10) Patent No.: US 7,563,717 B2
(45) Date of Patent: Jul. 21, 2009

(54) METHOD FOR FABRICATING A SEMICONDUCTOR DEVICE

(75) Inventor: Ji Hyung Yune, Goyang (KR)

(73) Assignee: Dongbu Electronics Co., Ltd., Seoul (KR)

( * ) Notice: Subject to any disclaimer, the term of this patent is extended or adjusted under 35 U.S.C. 154(b) by 212 days.

(21) Appl. No.: 11/318,442

(22) Filed: Dec. 28, 2005

(65) Prior Publication Data

US 2006/0141791 A1    Jun. 29, 2006

(30) Foreign Application Priority Data

Dec. 29, 2004  (KR) .................. 10-2004-0114689

(51) Int. Cl.
   *H01L 21/20* (2006.01)
(52) U.S. Cl. .............. 438/692; 438/584; 438/693; 438/745; 438/746; 438/747; 257/E21.165; 257/E21.168; 257/E21.171; 257/E21.304; 257/E21.586
(58) Field of Classification Search ......... 438/691–693, 438/584, 745, 746, 747, 750; 257/E21.23, 257/E21.303, E21.304, E21.165, 168, 171, 257/242, 304, 585, 586, E23.075
   See application file for complete search history.

(56) References Cited

U.S. PATENT DOCUMENTS

| | | | | |
|---|---|---|---|---|
| 5,664,990 A | * | 9/1997 | Adams et al. ................ 451/60 |
| 5,827,781 A | * | 10/1998 | Skrovan et al. ............. 438/692 |
| 6,124,207 A | * | 9/2000 | Robinson et al. ............ 438/692 |
| 6,368,955 B1 | * | 4/2002 | Easter et al. ................ 438/633 |
| 6,429,134 B1 | * | 8/2002 | Kubota et al. ............... 438/692 |
| 6,465,887 B1 | * | 10/2002 | Chu et al. ................... 257/751 |
| 6,596,581 B2 | * | 7/2003 | Park et al. ................... 438/253 |
| 6,602,439 B1 | * | 8/2003 | Hampden-Smith et al. . 252/79.1 |
| 6,776,696 B2 | * | 8/2004 | Mahulikar et al. ............ 451/57 |
| 6,794,285 B2 | * | 9/2004 | Matsui et al. ............... 438/633 |
| 7,125,795 B2 | * | 10/2006 | Kuo et al. ................... 438/637 |
| 2001/0036738 A1 | * | 11/2001 | Hatanaka et al. ............ 438/693 |
| 2003/0124863 A1 | * | 7/2003 | Hwang et al. ............... 438/694 |
| 2003/0207582 A1 | * | 11/2003 | Twu et al. ................... 438/709 |

\* cited by examiner

*Primary Examiner*—Michael S Lebentritt
(74) *Attorney, Agent, or Firm*—McKenna Long & Aldridge LLP

(57) ABSTRACT

The method includes chemical-mechanical polishing to planarize an insulating interlayer deposited on a lower pattern. The insulating interlayer is polished using a surfactant. The chemical-mechanical polishing includes at least two separate polishing steps of different fluxes of the surfactant. The first polishing step is performed for touching up an upper side of the insulating layer. The second polishing step is performed, after completing the first polishing step, for planarizing the insulating interlayer.

8 Claims, 3 Drawing Sheets

METHOD FOR FABRICATING A SEMICONDUCTOR DEVICE

CROSS REFERENCE TO RELATED APPLICATION

This application claims the benefit of Korean Patent Application No. 10-2004-0114689, filed on Dec. 29, 2004, which is hereby incorporated by reference as if fully set forth herein.

BACKGROUND OF THE INVENTION

1. Field of the Invention

The present invention relates to a method for fabricating a semiconductor device, and more particularly, to a process of planarizing an insulating interlayer deposited on a lower pattern layer in a semiconductor device.

2. Discussion of the Related Art

In manufacturing highly integrated semiconductor devices, including device processes for miniaturization (i.e., lower design rules) and increasing capacitances, the formation of multiple layers within a limited area increases the complexity of the structure of the devices, thereby causing additional surface unevenness and increasing the need for planarization. Planarization is a process in which a step differential is removed or reduced by planarizing one or more intermediate layers. For example, a first portion of an insulating interlayer, for example, a metal wiring layer, may be at a higher level than a second portion of the insulating interlayer, for example, the gaps between the lines of metal. As a result, the surface of the insulating interlayer should be planarized by, for example, chemical-mechanical polishing. Chemical-mechanical polishing is a process that may obtain remove any unevenness over relatively large areas. In planarization by chemical-mechanical polishing, the uneven layer is planarized by a frictional force between a slurry, functioning as the chemical polishing material, and a pad, functioning as the mechanical polishing material. Chemical-mechanical polishing generally uses a surfactant, for example, TK, having a predetermined flow rate ("flux") typically expressed as the amount of supplied surfactant in milliliters flowing over the surface per minute.

FIG. 1 shows the result of a conventional process for chemical-mechanical polishing. An insulating interlayer 102 is deposited on a substrate 106, on which a metal wiring layer (not shown) has been formed, and a contact hole 104 is etched to form a contact plug (not shown) in the planarized surface of the insulating interlayer. Although the desired thickness of the majority of the insulating interlayer 102 is 750 nm after planarization, the insulating interlayer thickness is 357 nm after planarization, or about 300 nm less than the desired thickness, and is achieved by polishing the insulating interlayer for about 100 seconds at a TK flux of 6.5 ml per minute. The conventional process for chemical-mechanical polishing is performed as a single-step process at a given flow rate of the surfactant, i.e., a process using a constant TK flux value. The rate of polishing performed with respect to an insulating interlayer deposited on a predetermined pattern may vary according to the specific portions of different surface areas of the insulating interlayer, causing an unevenness throughout the insulating interlayer by imparting a higher-density portion with a thickness different than that of a lower-density portion. This thickness variation can be detected by photographing the planarized layer to observe a color variation across a plan view of the substrate. Different colors can indicate the respectively varying thicknesses of the layer.

With the above-described non-uniformity in the thickness of an insulating interlayer, the depth of focus in a photolithography step increases, thereby degrading tolerance margins. Moreover, the inconsistent size of the cross section of the insulating interlayer results in difficulties in performing a contact etching process (contact plug formation) with respect to the insulating interlayer. As a result, the number of defective contacts generated increases, which leads to more open/short failures and higher leakage currents, thereby lowering yield.

As an example, a sample set of eight-inch wafers can be treated with the conventional polishing process, and open/short failure testing is performed at several hundred positions in each wafer, followed by leakage current (Icc3) testing. The open/short failure rate has been found to be 4.69%, with an Icc3 failure rate of 57.45%, such that the overall pass rate of only 17.04%.

SUMMARY OF THE INVENTION

Accordingly, the present invention includes a method for fabricating a semiconductor device that can substantially obviate one or more problems of the related art.

The present invention can provide a method for fabricating a semiconductor device that enables more consistent insulating interlayer thicknesses.

The present invention can also provide a method for fabricating a semiconductor device that a tolerance margin in the photolithography for a contact hole etching process.

Additional advantages and features of the invention will be set forth in part in the description which follows and in part will become apparent to those having ordinary skill in the art upon examination of the following. These and other advantages of the invention may be realized and attained by the structure particularly pointed out in the written description, drawings and claims.

As embodied and broadly described herein, there is provided a method for fabricating a semiconductor device. The method can comprise chemical-mechanical polishing an insulating interlayer deposited on a lower pattern by polishing the insulating interlayer using a surfactant, the chemical-mechanical polishing including at least two separate polishing steps with surfactant at different fluxes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate one or more embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, like reference designations will be used throughout the drawings to refer to the same or similar parts.

According to an embodiment of the present invention, a method for fabricating a semiconductor device is a two-step process of chemical-mechanical polishing. The present invention can include one polishing step for performing a touch-up of the upper surface of an insulating interlayer deposited on a pattern and another polishing step for substantially polishing the insulating interlayer. Generally, the touch-up step occurs prior to the substantial polishing step. The first polishing step is performed at a first surfactant flux, optionally for about 200 seconds, and the second polishing step is performed at a second surfactant flux, optionally for about 100 seconds. Accordingly, the first flux value is optionally different from the second flux value. The first surfactant flux of the first polishing step is optionally about 10 ml per minute and the second surfactant flux of the second polishing step is optionally about 6.5 ml per minute. In an exemplary embodiment of the present invention, the surfactant used is TK.

Figure 1:
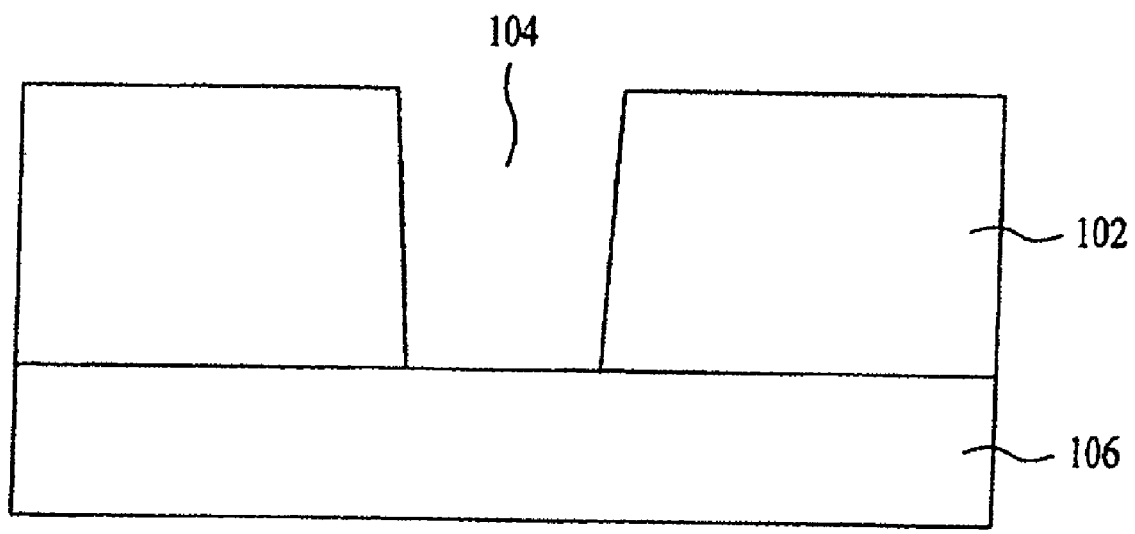
FIG. 1 is a cross-sectional view of a predetermined portion of an eight-inch wafer processed according to the conventional art.
Figure 2:
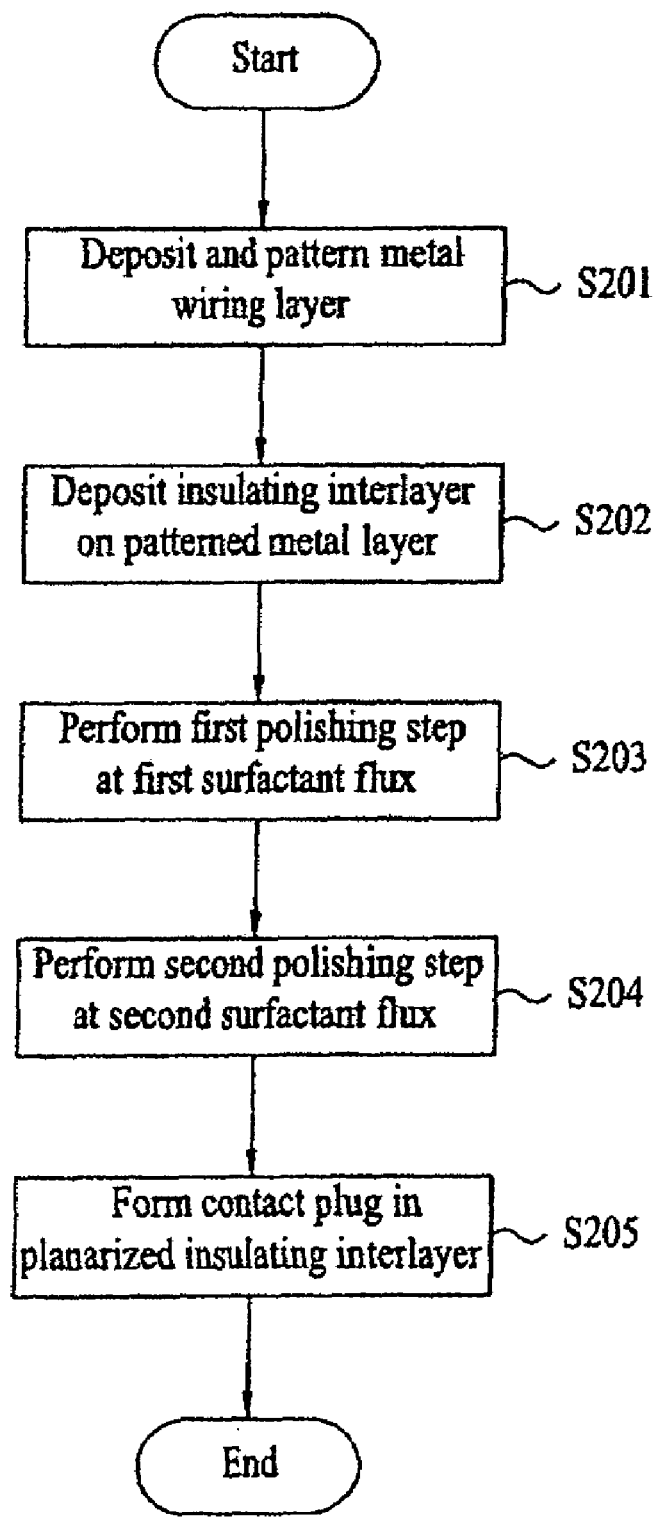
FIG. 2 is a flowchart of a method for fabricating a semiconductor device according to the present invention, illustrating a chemical-mechanical polishing process performed according to the method of the present invention.

Referring to FIG. 2, the method for fabricating a semiconductor device according to the present invention can include a chemical-mechanical polishing process performed as two separate steps. First, a metal wiring layer is deposited and patterned (S201), and the insulating interlayer is thereafter deposited to a predetermined thickness on the patterned metal layer (S202). The metal wiring layer can be deposited and patterned in a conventional manner. The first polishing step is performed at a first surfactant flux (S203), as a touch-up step in preparation for the second polishing step, and subsequently the second polishing step is performed at a second surfactant flux (S204) to impart the insulating interlayer with a planarized surface. Subsequently, a contact hole is formed in the planarized insulating interlayer, using photolithography of a contact hole etching process. The contact hole is filled with a conductive material to form a contact plug (S205).

Figure 3:
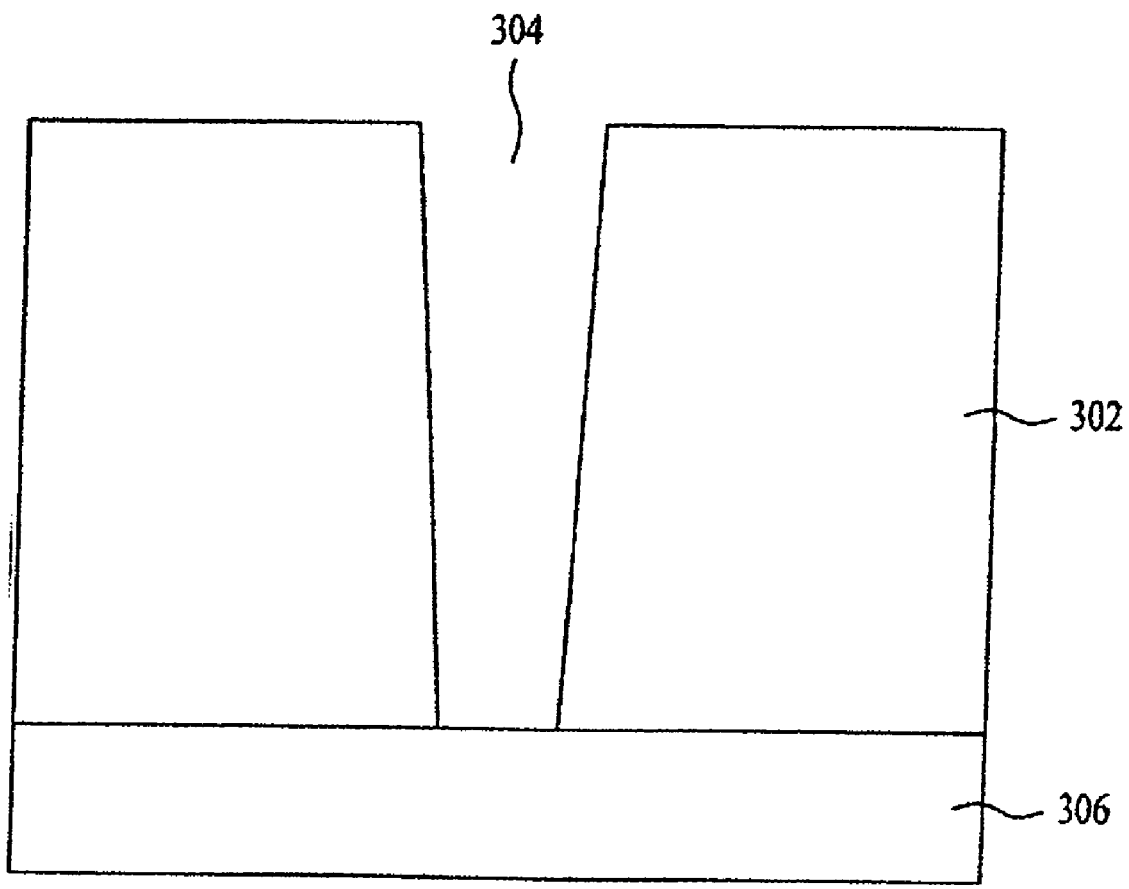
FIG. 3 is a cross-sectional view of a predetermined portion of an eight-inch wafer processed by a method for fabricating a semiconductor device according to the present invention.

Referring to FIG. 3, an insulating interlayer 302 is deposited on a substrate 306 on which a metal wiring layer (not shown) has been formed, and a contact hole 304 is etched for forming a contact plug (not shown) in the planarized surface of the insulating interlayer. After completing the polishing process according to one embodiment of the present invention, the thickness of an insulating interlayer 302 can be substantially about 666 nm, which is much closer to the desired thickness of 750 nm.

To determine an exemplary yield obtained by a method of the present invention, a sample set of eight-inch wafers is treated with the chemical-mechanical polishing process according to one embodiment of the present invention, and open/short failure testing is carried out at several hundred positions in each wafer, followed by leakage current (Icc3) testing. This test corresponds to the testing of the sample discussed in the Discussion of the Related Art section. The open/short failure rate has been found to be 0.06% (about $1/78^{th}$ of the sample processed with the conventional methods), with an Icc3 failure rate of 18.84%, result in an overall pass rate of 67.65%.

By the present invention, an undesired thinning of portions of the insulating interlayer can be prevented by providing a lower thickness differential between a higher-density portion of the insulating interlayer and a lower-density portion of the insulating interlayer. As a result, the chemical-mechanical polishing according to a method of the present invention minimizes any deviation in insulating interlayer thickness over the entire wafer, thereby improving yield by increasing a tolerance margin in the photolithography for contact hole formation.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method for fabricating a semiconductor device, comprising:
   depositing an insulating interlayer on a lower pattern;
   chemical-mechanical polishing the insulating interlayer using a surfactant, said chemical-mechanical polishing including at least two separate polishing steps using different fluxes of the surfactant,
   wherein the at least two separate polishing steps include a first polishing step for touching up an upper side of the insulating interlayer using a first flux of the surfactant and a second polishing step for planarizing the insulating interlayer using a second flux of the surfactant,
   wherein the first flux of the surfactant is greater than the second flux of the surfactant.

2. The method as claimed in claim 1, wherein the second polishing step is performed after the first polishing step.

3. The method as claimed in claim 1, wherein the first flux of the surfactant is about 10 ml per minute and wherein the second flux of the surfactant is about 6.5 ml per minute.

4. The method as claimed in claim 3, wherein the first polishing step is performed for 200 seconds and wherein the second polishing step is performed for 100 seconds.

5. The method as clamed in claim 4, wherein the surfactant is TK.

6. A method for fabricating a semiconductor device, comprising:
   depositing an insulating interlayer on a lower pattern, the insulating interlayer comprising a first portion of high density and a second portion of low density;
   a first polishing step for touching up an upper side of the insulating interlayer; and
   a second polishing step for planarizing the insulating interlayer,
   wherein the first and second polishing steps are performed using different values of flux of a surfactant in order to decrease a difference of thickness between the first portion and the second portion,
   wherein a first flux of the surfactant for the first polishing step is greater than a second flux of the surfactant for the second polishing step.

7. The method as claimed in claim 6, wherein said first and second polishing steps perform chemical-mechanical polishing of the insulating interlayer.

8. The method as darned in claim 6, further comprising:
   forming a contact plug in the planarized insulating interlayer using photolithography of a contact hole etching process.

* * * * *